United States Patent [19]

Marcuse et al.

[11] 4,292,341
[45] Sep. 29, 1981

[54] METHOD OF CONTROLLING THE INDEX PROFILE OF OPTICAL FIBER PREFORMS

[75] Inventors: Dietrich Marcuse, Lincroft; Herman M. Presby, Highland Park, both of N.J.

[73] Assignee: Bell Telephone Laboratories, Incorporated, Murray Hill, N.J.

[21] Appl. No.: 124,923

[22] Filed: Feb. 26, 1980

[51] Int. Cl.³ .................. G03C 17/02; G02B 1/10; G02B 5/14
[52] U.S. Cl. .................. 427/10; 65/3.11; 427/8; 427/163
[58] Field of Search .................. 427/8, 10, 163; 65/3 A

[56] References Cited

U.S. PATENT DOCUMENTS

| | | | |
|---|---|---|---|
| 3,373,278 | 3/1968 | Cilyo | 427/8 |
| 3,654,109 | 4/1972 | Hohl et al. | 427/10 |
| 4,161,656 | 7/1979 | Marcuse et al. | 250/459 |
| 4,217,027 | 8/1980 | MacChesney et al. | 427/163 X |

OTHER PUBLICATIONS

Takahashi et al., "Applicative Investigation of X-Ray Non-Destructive Inspection Technique for Measurement of Core Diameters and Germanium Doping Concentration Profiles of Optical Fiber Preforms", Proc. Opt. Comm. Conf. Amsterdam, Sep. 17, 1979, pp. 14.41 to 14.44.

Primary Examiner—James R. Hoffman
Attorney, Agent, or Firm—Sylvan Sherman

[57] ABSTRACT

The refractive index profile of an optical fiber preform is controlled during manufacture by illuminating the gaseous precursor being fed to the preform substrate tube with ultraviolet radiation, measuring the intensity of either the uv that traverses the gas or the induced fluorescence, comparing this measurement with a reference signal, generating an error signal, in response to this comparison, and controlling composition of the gaseous precursor in response to said error signal. A similar technique can be used to control the thickness and refractive index of each layer deposited upon the substrate tube by forming an x-ray shadowgraph of the layers as they are deposited and comparing the shadowgraph characteristics with appropriate reference signals to form a second set of error signals. The latter are then used to fine tune the fabrication process. The invention can also be employed in conjunction with the vapor axial deposition method of fabricating preforms.

16 Claims, 7 Drawing Figures

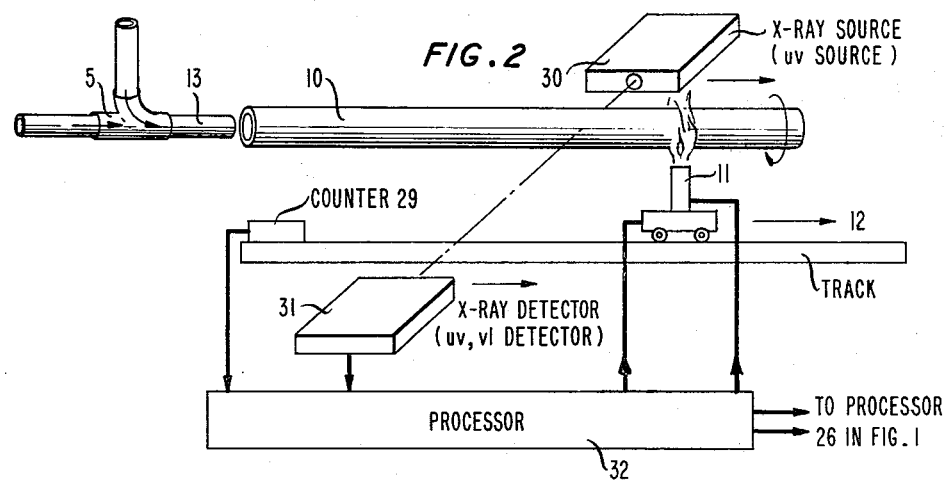
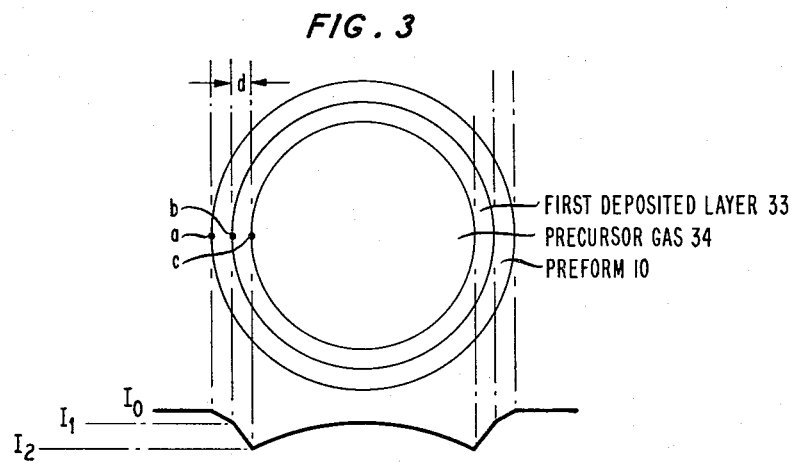
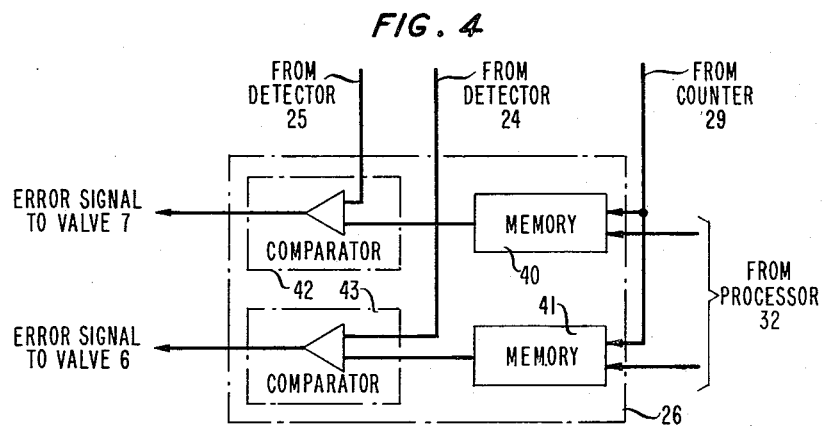

METHOD OF CONTROLLING THE INDEX PROFILE OF OPTICAL FIBER PREFORMS

TECHNICAL FIELD

This invention relates to methods for controlling the refractive index profile of optical fiber preforms.

BACKGROUND OF THE INVENTION

As is known, efficient transmission of optical wave energy along a multimode optical fiber is achieved by grading the refractive index of the fiber core. Thus, accurate knowledge of the index profile is necessary in order to assess a fiber's transmission properties. To this end, various techniques have been developed for measuring the index profile of optical fibers and optical fiber preforms. For example, U.S. Pat. No. 4,161,656 discloses various techniques for determining the distribution of the index modifying dopants in optical fibers and fiber preforms by observing the reaction of a fiber/-preform to ultraviolet (uv) illumination. From this measurement, the index profile can be computed.

The shortcoming of this and various other measuring techniques is that they can only be employed after the fiber or preform has been made. A preferred arrangement would involve making measurements while the preform is being fabricated and, thereby, providing information with which to control the fabrication process itself. By this means, the resulting index distribution within the preform could be made to more closely approximate the desired profile. It is clear that such an approach would serve to reduce the number of unacceptable preforms produced and, thereby, reduce the cost of fabricating optical fibers.

SUMMARY OF THE INVENTION

The present invention is particularly applicable to the so-called "modified chemical vapor deposition" (MCVD) process in which a precursor, in the form of a gas containing glass forming material and suitable index modifying dopants, is caused to flow into a preform substrate tube wherein it is heated. This causes a layer of glass to be deposited on the inner surface of the tube.

The thickness of each deposited layer, and the concentration of dopants within each layer are functions of a number of parameters including the temperature of the hot zone created within the tube, the speed with which the hot zone moves along the tube, and the concentrations of the glass forming material and the index modifying dopants within the gas. If the temperature and speed of the hot zone are maintained constant, the thickness and the refractive index of each layer can be controlled by controlling the material concentrations within the gaseous precursor. Thus, in accordance with one aspect of the present invention, the material concentrations within the gaseous precursor being delivered to the preform substrate tube is monitored and controlled during the manufacture of the preform by a method characterized by the steps of: illuminating the gaseous precursor with ultraviolet radiation; measuring the intensity of radiant energy derived from said gaseous material; comparing said measurement with a reference signal and generating an error signal in response to this comparison; and changing the material concentration in said gaseous material, as required, in response to said error signal.

In one embodiment of the invention, the radiant energy measured is the uv radiation that traverses the gas.

In an alternate embodiment of the invention, the dopant concentration is determined by measuring the fluorescence induced in the dopants by the uv radiation.

The control provided by the above-described technique can be considered a "coarse" adjustment. Ultimately, it is the actual thickness of each glass layer deposited within the preform substrate tube, and the dopant concentration within each layer that determines the index profile of the resulting preform. Thus, in accordance with a second aspect of the present invention, measurements are also made of the deposited layers employing an x-ray shadowgraph. "Fine" adjustments in the fabrication parameters are then made in response to these measurements. These can include modifying the flame temperature, the speed with which the flame moves along the preform, and/or changing the gas flow to the substrate tube.

In all cases, it is an advantage of the present invention that the measurements are made during the fabrication of the preform and, thus, provide a means of optimizing the index profile.

BRIEF DESCRIPTION OF THE DRAWINGS

FIG. 2 shows an arrangement for monitoring and controlling the index profile of an optical fiber preform in accordance with a second aspect to the invention;

FIG. 3, included for purposes of explanation, shows a cross section of a fiber preform and an x-ray shadowgraph produced thereby;

FIGS. 4 and 5 show, in block diagram, illustrative signal processors for use in connection with the present invention;

DETAILED DESCRIPTION

Figure 1:
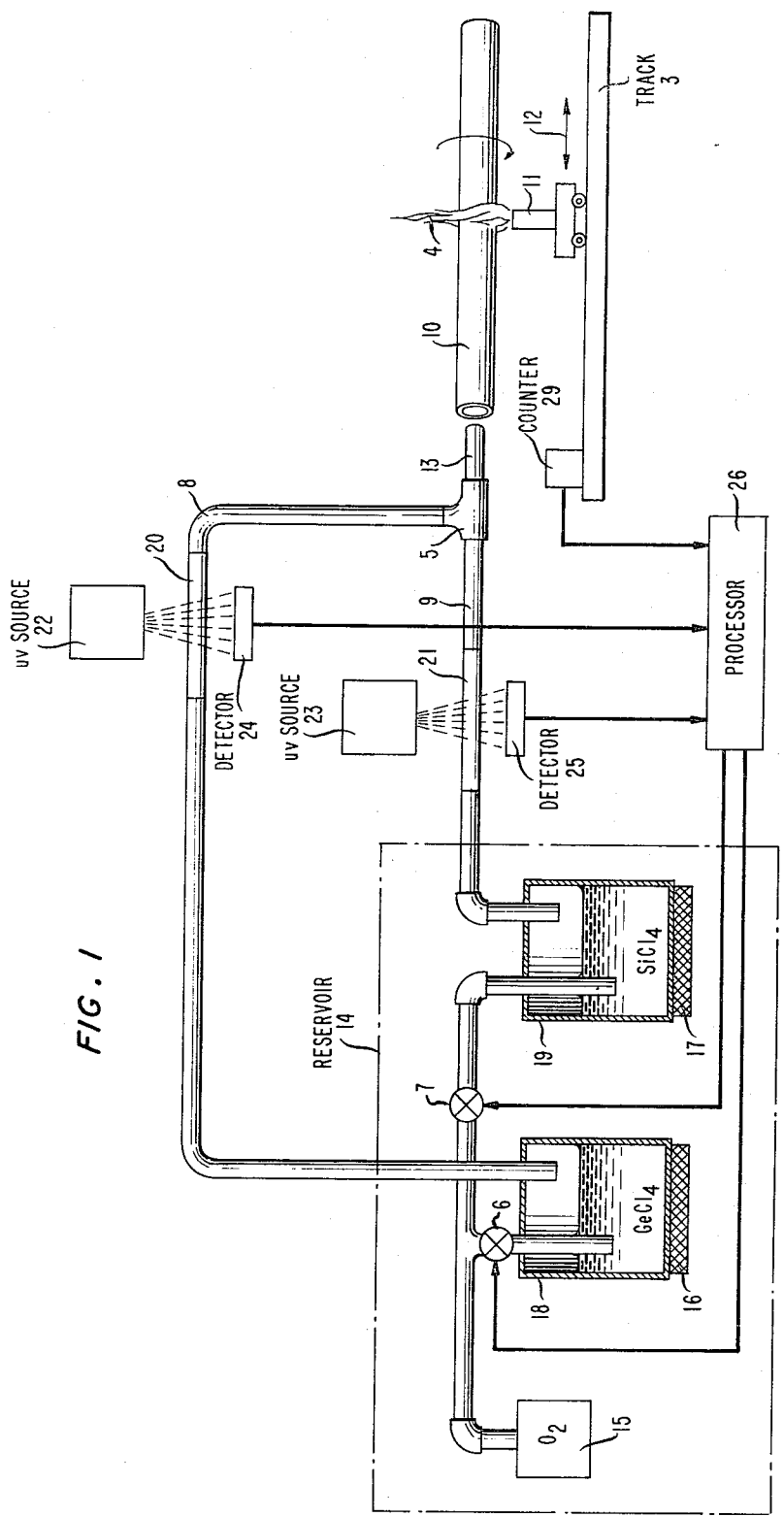
FIG. 1 shows an arrangement in accordance with a first aspect of the present invention for monitoring and controlling the index profile of an optical fiber preform.

Referring to the drawings, FIG. 1 shows a first arrangement for monitoring and controlling the index profile of an otpical fiber preform fabricated by means of the MCVD process. As explained more fully in the copending application by J. B. MacChesney and P. B. O'Connor, Ser. No. 828,617, filed Aug. 29, 1979, now U.S. Pat. No. 4,217,027, and assigned to applicants' assignee, in accordance with this process a substrate tube is held and rotated (by means not shown) as a hot zone is caused to move along the tube in the direction indicated by arrow 12. Typically, the hot zone is produced by a flame 4 from a heating means 11 which is shown mounted on a track 3. Simultaneously, a gaseous precursor is introduced into tube 10 via an inlet pipe 13 which is connected to a material reservoir 14 by means of two pipes 8 and 9. The reservoir typically includes a source 15 of oxygen, a source 18 of an index modifying dopant material, such as germanium tetrachloride, and a source 19 of a host glass forming material, such as silicon tetrachloride. The oxygen source is connected by means including a first valve 6 to source 18, and by means including a second valve 7 to source 19.

These materials are typically in a liquid state and are advantageously heated by means of heaters 16 and 17. In operation, the gas from source 15 is bubbled through the index modifying dopant solution and the glass forming solution. The resulting gaseous mixtures are then fed by means of pipes 8 and 9 to a coupler 5 wherein they are combined. The combined mixture is, in turn, fed by means of inlet pipe 13 into the preform tube 10 wherein it is heated, resulting in the deposition of a layer of glass upon the inside surface of tube 10.

Of particular interest are the refractive index and thickness of each of the deposited layers. The refractive index of each layer is primarily a function of the relative concentrations of the two materials within the gaseous mixture. The layer thickness is a function of the concentration of the host glass forming material within the precursor gas, the temperature of the hot zone, and the rate of advance of the hot zone. Assuming that the temperature and speed of the hot zone are maintained constant at previously determined optimum values, the only things that need be controlled to obtain the desired profile are the concentrations of the host glass forming and index modifying materials. In the illustrative embodiment, this is accomplished by separately measuring the concentration of $GeCl_4$ and $SiCl_4$ in the respective pipes 8 and 9. To make these measurements, at least a section 20-21 of each pipe 8-9 is made of a material, such as fused silica, that is transparent to uv radiation, and the gas flowing therethrough is illuminated by means of a uv source 22, 23. In each case, the radiation is incident upon the gas in a direction that is transverse to the direction of gas flow through the tube section. In one embodiment of the invention, a detector 24, 25 located on the side of the section opposite the uv source, measures the intensity of the uv energy that has passed through the gas. Because the absorption of the uv energy by $GeCl_4$ and $SiCl_4$ varies as a function of their respective concentrations, the two intensity measurements are relevant to the thickness and the refractive index of the layer that will be deposited on the substrate tube. The detector outputs thus produced are coupled to a processor 26 which compares the measured values to stored reference values. If the difference between the measured and the stored signals indicates too low a concentration, a signal is generated which serves to open the appropriate valve to permit a greater gas flow through the appropriate material source. Alternatively, if the difference indicates too high a concentration, the error signal causes an appropriate reduction in the gas flow.

In an alternative embodiment of this aspect of the invention, the frequency of the uv light is selected to cause the particular material of interest to fluoresce. In this second embodiment, the detectors are advantageously displaced so as not to intercept any of the uv radiation. The induced visible light (vl), however, is sensed and the detected signals are coupled to processor 26 wherein an error signal is generated in the manner described hereinabove.

Thus, in accordance with this first aspect of the invention, the concentration of the index modifying dopant and the glass forming material are monitored and controlled as a means of controlling the refractive index and the thickness of the preform layers as the latter are being deposited upon the preform substrate tube.

An alternative method of controlling the preform fabrication process in accordance with the present invention involves making direct measurements of the layers as they are deposited upon the preform substrate, and varying the fabrication parameters, as required, in response to these measurements. An arrangement for making these measurements, using an x-ray shadowgraph, is illustrated in FIG. 2 which shows a portion of FIG. 1 including a substrate tube 10, heating means 11, and gas input pipe 13. Also shown are x-ray source 30 and an associated x-ray detector 31.

As explained in a paper entitled "Applicative Investigation of X-Ray Non-Destructive Inspection Tehchnique for Measurement of Core Diameters and Germanium Doping Concentration Profiles of Optical Fiber Preforms," by H. Takahashi et al, published in the *Proceedings of the Optical Communication Conference*, Amsterdam, Sept. 17-19, 1979, when a high-silica preform is illuminated by a uniform beam of x-rays, the intensity distribution of the emergent x-ray beam is modified in the manner illustrated in FIG. 3 which shows the preform cross section, including a single deposited layer, and the corresponding intensity distribution of the x-ray beam as sensed by x-ray detector 31. In the region external to the preform tube 10, the detected x-ray intensity is a maximum, given by $I_0$. Over the interval between point a, located on the outside surface of tube 10 and point b, located on its internal surface, the detected intensity decreases from $I_0$ to $I_1$ as the x-ray path includes larger and larger chords within tube 10. Upon entering the first layer 33, the detected intensity continues to decrease but at a steeper slope due to the presence of the index modifying dopant, resulting in a discontinuity at the tube-layer interface b. Similarly, there is a sharp discontinuity in the intensity curve at the interface c of layer 33 and the gaseous precursor 34 that fills the balance of the region within tube 10.

As is evident from the intensity distribution curve thus defined, the thickness d of layer 33 is clearly defined by the distance between the discontinuities at interfaces b and c, whereas the dopant concentration is a function of the difference in the measured intensitites $I_1$ and $I_2$.

These measured values are coupled to a processor 32 wherein they are compared to previously stored reference values and appropriate error signals are generated. These error signals are then used in any one of a number of ways to modify the system parameters. For example, if it is determined that the layer thickness is too large, the error signal can be used to increase the rate at which the hot zone advances along the tube. If the measured layer thickness is too small, the rate of advance can be reduced. Alternatively, the error signal can be used to control the flame temperature and/or the concentration of materials in the gaseous precursor. If, for example, the layer is too thick, the error signal can be used to modify the reference signal stored in processor 26 of FIG. 1, thus modifying the control signal supplied to valve 7 in FIG. 1. This has the effect of "fine tuning" the gas flow and, in this particular illustration, serves to reduce the amount of $SiCl_4$ in the gas mixture. Similarly, if it is found that the dopant concentration is not correct, an appropriate modification of the control signal applied to valve 6 will "fine tune" the concentration of index modifying dopant in the gas mixture.

Advantageously, the x-ray source and x-ray detector are suitably mounted on a movable stand (not shown) so as to track directly behind the advancing hot zone. By this means, the layers are constantly monitored and corrections are made continuously as each layer is deposited within tube 10. Thus, the slightest deviation in either layer thickness or refractive index is quickly detected and the appropriate corrections made.

FIG. 4 shows, in block diagram, an illustrative embodiment of processor 26 for generating the error signals that control the gas flow through valves 6 and 7. The processor comprises a pair of memory circuits 40 and 41 which store the relevant reference signals for each layer that is to be deposited. One store of signals, as in memory 41, relates to the dopant concentrations whereas the other store, as in memory 40, relates to the layer thicknesses. A signal from a counter 29, located at one end of track 3, identifies the particular layer being put down and permits the memory circuit to select the appropriate reference signal. Following each pass of the flame, the counter is advanced by the returning heater 11 and a new reference signal is provided by each of the memory circuits 40 and 41. These, along with the detected signals from detectors 25 and 24 are coupled to comparator circuits 42 and 43, respectively, in which they are compared and the error signals generated. The latter are then coupled to the appropriate controls for modifying the fabrication parameters. In the illustrative embodiment, the controlled components are flow valves 6 and 7.

Figure 5:
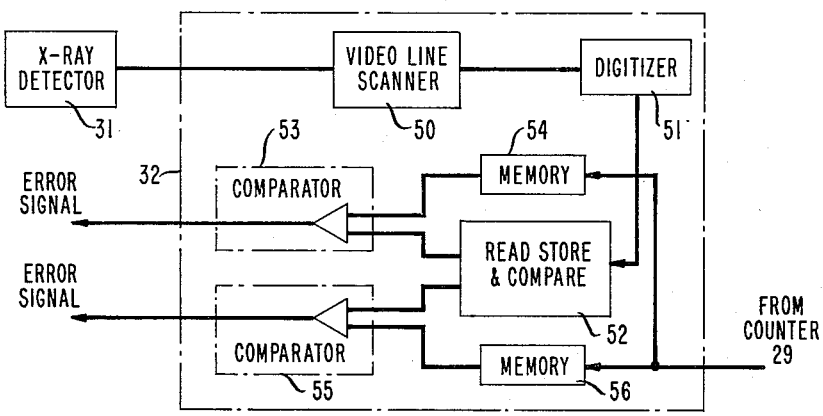

FIG. 5 shows, in block diagram, an illustrative embodiment of processor 32 for generating error signals in response to signals from x-ray detector 31. The processor includes a video line scanner 50 whose output is an analogue waveshape of the type illustrated in FIG. 3. A digitizer 51 measures the amplitudes of the signals from line scanner 50 and converts the measured amplitudes to digital form for convenience. These signals are read, stored and compared in a read, store and compare circuit 52.

Figure 6:
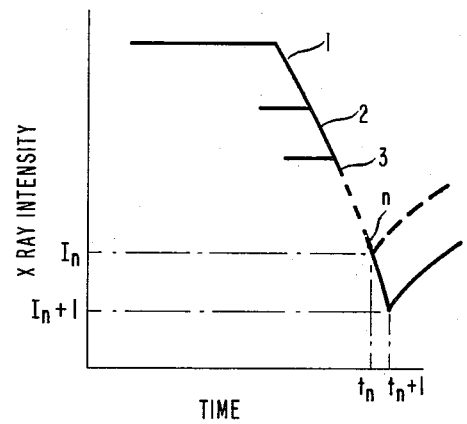
FIG. 6, included for purposes of explanation, shows an x-ray shadowgraph of a fiber preform having a plurality of deposited layers.

As indicated in connection with FIG. 3, each layer that is deposited results in a decrease in the intensity of the detected x-rays. FIG. 3 illustrated this with respect to one layer. FIG. 6, now to be considered shows a portion of the shadowgraph for a plurality of n+1 layers. As shown, each layer results in a decrease in x-ray intensity. To determine whether the dopant concentration is proper, the change in x-ray intensity is measured and compared to a reference signal that has previously been stored in the processor memory. Circuit 52 makes the required measurement by comparing the last intensity minimum with the new minimum. Thus, the minimum produced by the nth layer, and stored in circuit 52, is $I_n$. (The latter is clearly recognized as such by virtue of the abrupt change in intensity as the scan passes into the gas filled region of the substrate tube.) As the n+1 layer is deposited, a new minimum, $I_{n+1}$ is detected and compared to $I_n$. The resulting difference is, in turn, compared in comparator 53 with a reference signal from memory circuit 54, and an error signal is generated.

The width of the n+1 layer is determined by generating a signal whose amplitude is proportional to the elapsed time, (i.e., $t_{n+1}-t_n$) between the two measured minima $I_{n+1}$ and $I_n$. This difference signal is, in turn, compared in comparator 55 with a reference signal from memory circuit 56, and a second error signal is generated. As before, counter 29 identifies the layer in question.

As indicated hereinabove, these error signals can be used in a variety of ways. For example, the error signal from comparator 55, which relates to the layer thickness, can be used to control the flame temperature or the speed with which the flame advances along the preform tube. Alternatively, both error signals can be used to modify the magnitudes of the reference signals in processor 26 so as to fine tune the gas concentrations in the gaseous precursor supplied to tube 10. In any case, the effect is to provide a continuous control of the fabrication process.

An alternative means of obtaining deposition information can be obtained using uv illumination and either a uv or a fluorescence detector in place of the x-ray source and x-ray detector shown in FIG. 2. As the layers are deposited, the amount of uv radiation absorbed will increase, resulting in a decrease in the uv detector output. On the other hand, as more and more layers are deposited, the amount of fluorescence produced will increase. However, in each instance, the effect is dependent upon both the thickness of each layer and the dopant concentration within each layer. Thus, measurements made in this manner cannot be used to control the fabrication process as readily as the x-ray shadowgraph. However, it can be used to detect gross deviations in the fabrication process. For example, if a valve were to malfunction, significant changes in the anticipated level of uv or visible light (vl) would be detected. This change can be used to either alert the operator or simply shut down the equipment.

Figure 7:
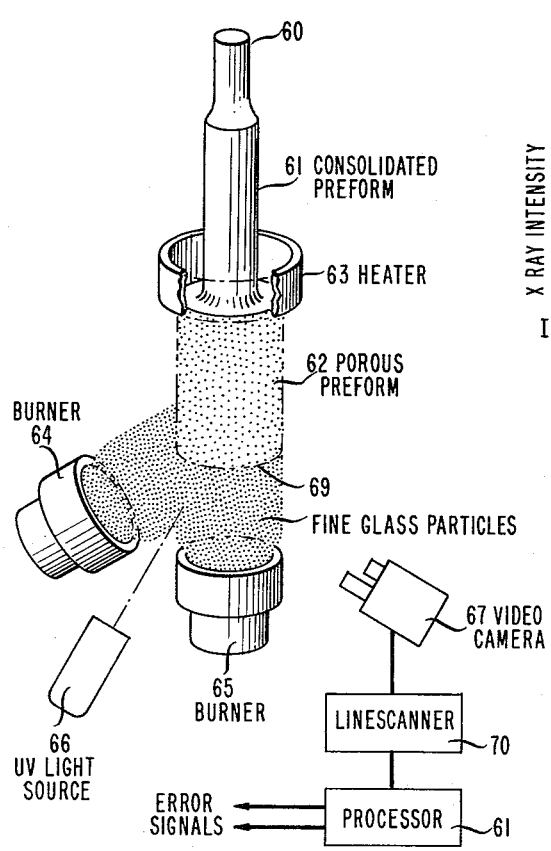
FIG. 7 shows the application of the invention to the VAD method of fabricating preforms.

In the description of the invention given hereinabove, reference was made to the MCVD process. However, the techniques described can be readily applied to other preform fabrication processes as well. For example, FIG. 7 illustrates the application of the invention to the vapor axial deposition (VAD) method of fabricating preforms wherein the glass forming materials are deposited at the end of the preform so that the latter grows longitudinally. FIG. 7 shows a portion of a starting silica rod 60, a section of consolidated preform 61, a section of porous preform 62, a heater 63 which consolidates the porous preform as it is pulled through the heater, and two oxyhydrogen burners 64 and 65 which supply the glass forming materials. Typically, the preform is rotated as the glass is deposited to obtain an axially symmetrical distribution of material. To monitor the actual preform profile, the exposed preform end is illuminated with uv whose wavelength is selected to induce fluorescence in the index modifying dopant. If more than one dopant is used, successive measurements are made at different wavelengths or, if the wavelengths of the uv and induced vl are sufficiently different for the several dopants, concurrent measurements can be made. In either case, a source 66 of uv light is directed at the exposed end surface 69 of preform 62. The resulting fluorescence is detected by means of a video camera 67. Advantageously, the camera is focused on the surface of the preform to minimize any interference produced by the incident cloud of glass forming material from burners 64 and 65.

A line scanner 70 connected to camera 67 monitors the intensity distribution of the fluorescence and, in conjunction with a processor 71 generates error signals to control the fabrication process in the manner described hereinabove.

In the embodiment of FIG. 1, the gas mixtures were monitored separately in pipes 8 and 9. However, because the attenuation peaks for the several materials occur at different wavelengths, these measurements can, alternatively, be made after the gases have been combined in pipe 13. Similarly, inasmuch as the wavelength necessary to induce fluorescence is different for the different materials, this measurement can also be made after the gases have been combined. Thus, various different arrangements can be devised to practice the invention.

We claim:

1. A method of fabricating an optical fiber preform characterized by a process that includes the steps of:
   illuminating (22, 23) the gaseous precursor being delivered to a preform substrate tube (10) with ultraviolet radiation;
   detecting (24, 25) the radiant energy from said illuminated gas;
   comparing (26) the intensity of the detected energy with a reference signal;
   and changing the concentration of the measured material in said gas in response to said comparison.

2. The method according to claim 1 wherein the radiant energy measured is the ultraviolet radiation that traverses said gas.

3. The method according to claim 1 wherein said ultraviolet radiation induces fluorescence in said material, and wherein the radiant energy measured is said induced fluorescence.

4. The method according to claim 1 wherein the gaseous precursor includes host glass forming material and index modifying material,
   and wherein said materials are separately measured and controlled.

5. The method according to claim 4 wherein the flow rate of the gas containing said materials is changed in response to said comparison.

6. The method according to claim 1 wherein successive layers of glass are deposited on said substrate tube, and wherein the appropriate reference signal is selected with regard to the particular layer being deposited.

7. A method of controlling the refractive index profile of an optical fiber preform during manufacture including the step of:
   depositing successive layers of glass on a substrate tube by heating said tube as it is exposed to a gaseous precursor capable of being consolidated into a glass by said heating;
   and further characterized by the steps of:
   illuminating a section of said tube with x-ray radiation;
   detecting (31) the spatial distribution of x-ray energy that traverses said illuminated tube section;
   comparing (32) characteristics of said detected energy with reference signals and generating error signals in response to said comparison;
   and changing the fabrication parameters of said process in response to said error signals.

8. The method according to claim 7 wherein said glass is consolidated by means of a heat source (11) that moves along the length of said tube (10);
   and wherein said x-ray source (30) and said x-ray detector (31) move along said tube behind said heat source.

9. The method according to claim 7 wherein one of said error signals is indicative of the thickness of a glass layer, and the other of said error signals is indicative of the refractive index of said layer.

10. The method according to claim 7 wherein the heating source moves along the length of said tube;
    and wherein the speed with which said source moves is changed in response to said one error signal.

11. The method according to claim 7 wherein the appropriate error signals are selected with regard to the particular layer being deposited.

12. The method according to claim 7 wherein said x-ray produces a shadowgraph having an intensity minimum,
    and wherein said one error signal varies as a function as the distance between successive minima in adjacent layers;
    and the other of said error signals is a function of the difference in the intensities of successive minima.

13. A method of controlling the refractive index profile of an optical fiber preform during manufacture including the step of:
    delivering to a preform substrate tube (10) a gaseous precursor including host glass forming materials ($O_2$, $SiCl_4$) and index modifying material ($GeCl_4$) and heating (11) said tube as the gaseous precurcor passes through said tube so as to deposit layers of glass therein;
    and further characterized by the steps of:
    illuminating (22, 23) the gaseous precursor being delivered to said tube with ultraviolet radiation while illuminating (30) a section of said tube with x-ray radiation;
    detecting (24, 25) the radiant energy derived from said illuminated gas while detecting (31) the spatial distribution of the x-ray energy that traverses said tube;
    comparing (26) the intensity of the detected energy derived from said gas with a first set of reference signals and generating a first set of error signals while comparing (32) characteristics of said detected x-ray energy with a second set of reference signals and generating a second set of error signals;
    and changing the fabrication parameters of said process in response to said error signals.

14. A method of controlling the refractive index profile of an optical fiber preform being fabricated by the vapor axial deposition method including the step of:
    directing a stream of particulate precursor material capable of being consolidated into glass onto an end surface (69) of said preform (62);
    characterized by the further steps of:
    illuminating (66) said end surface with ultraviolet light,
    detecting (67) the resulting fluorescence produced at said end surface (69) by said uv light;
    and processing (71) said detected fluorescence to produce error signals for controlling said fabrication method.

15. A method of monitoring the deposition process during the manufacture of an optical fiber preform including the step of:
    depositing successive layers of glass on a substrate tube by heating said tube as it is exposed to a gaseous precursor capable of being consolidated into a glass by said heating;
    and further characterized by the steps of:
    illuminating a section of said tube with ultraviolet radiation;
    detecting the radiant energy derived from said tube;
    comparing the intensity of the detected energy with a reference signal and generating an error signal in response to said comparison;
    and adjusting the fabrication procedure as required by said error signal.

16. The method according to claim 15 wherein said ultraviolet radiation induces fluorescence in said deposited material;
    and wherein the radiant energy measured is said induced fluorescence.

* * * * *